United States Patent [19]

Imaguchi

[11] 4,140,984

[45] Feb. 20, 1979

[54] MECHANICAL FILTER

[75] Inventor: Ichiro Imaguchi, Tokyo, Japan

[73] Assignee: Kokusai Electric Co., Ltd., Tokyo, Japan

[21] Appl. No.: 818,019

[22] Filed: Jul. 22, 1977

[30] Foreign Application Priority Data

Jul. 22, 1976 [JP] Japan .................................. 51-87520

[51] Int. Cl.² .................. H03H 9/04; H03H 9/26; H01L 41/08
[52] U.S. Cl. ...................................... 333/72; 310/322; 333/71
[58] Field of Search .................. 333/72, 30 R, 71; 310/321, 322, 323, 324, 329, 328, 348, 357, 363, 365, 366, 369; 29/594, 25.35, 601

[56] References Cited

U.S. PATENT DOCUMENTS

| 2,877,432 | 3/1959 | Mattiat | 310/369 |
| 3,187,412 | 6/1965 | Tiemann | 29/601 |
| 3,984,790 | 10/1976 | Tanak | 310/321 |

*Primary Examiner*—Alfred E. Smith
*Assistant Examiner*—Marvin Nussbaum
*Attorney, Agent, or Firm*—Bacon & Thomas

[57] ABSTRACT

A mechanical filter including resonators, a coupler for longitudinally coupling the resonators, electromechanical transducers coupled to the opposite ends of the coupler, and lead wires led out from the transducers. Each of the transducers comprises a piezoelectric ceramic resonator adapted for longitudinal resonance and having electrodes attached to the opposite end faces thereof, and one of the end faces of the piezoelectric ceramic resonator is formed with a coupling hole which is located substantially on the axis thereof and extends lengthwise of the ceramic resonator. Each end of the coupler is inserted into the coupling hole with an electrically conductive adhesive to thereby couple the coupler and ceramic resonators. The aforementioned lead wires may be connected to the electrodes and wound about the piezoelectric ceramic resonators through a predetermined number of turns, and may be secured to the ceramic resonators by an adhesive having rubber-like elasticity.

1 Claim, 6 Drawing Figures

U.S. Patent  Feb. 20, 1979  4,140,984
FIG. I
PRIOR ART
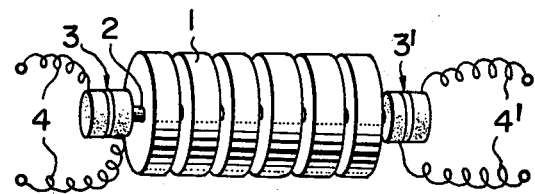
FIG. 2
PRIOR ART
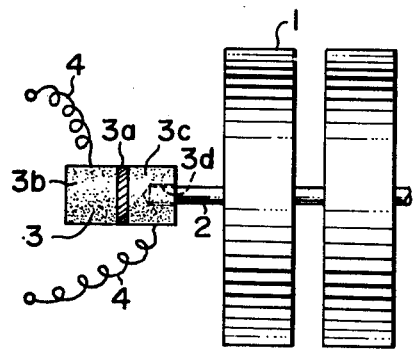
FIG. 3
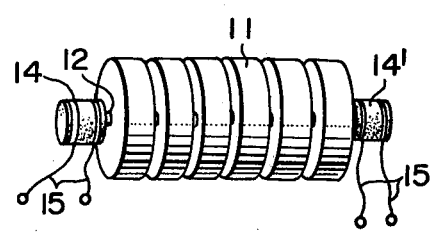
FIG. 4
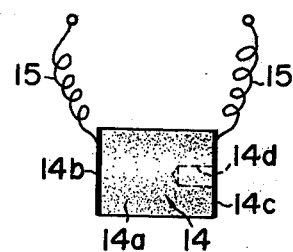
FIG. 6
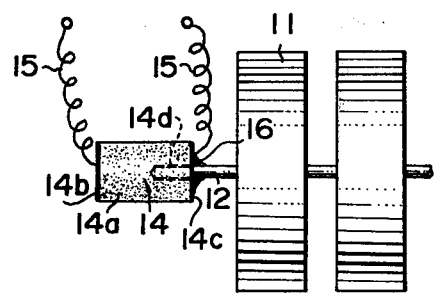
FIG. 5
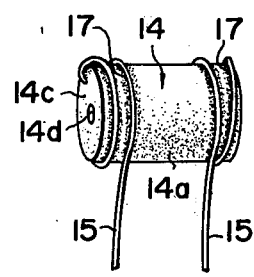

MECHANICAL FILTER

This invention relates to a mechanical filter usable, for example, as an intermediate frequency filter for radio communication apparatus.

As intermediate frequency filter for radio communication apparatus, use has been made of a mechanical filter of a narrow band whose center frequency is in the neighborhood of 455 KHz and which uses so-called Langevin type transducers. However, such a conventional mechanical filter is disadvantageous in that the Langevin transducers used therein are complicated in construction and accordingly difficult to machine.

It is an object of this invention to eliminate the drawbacks of the prior art.

Another object of this invention is to provide an improved mechanical filter which can enhance the production efficiency and reduce the cost of fabrication.

Other objects, features and advantages of this invention will become apparent from the following description taken in connection with the accompanying drawings.

FIG. 1 is a schematic perspective view showing an example of the prior-art mechanical filter.

FIG. 2 is an enlarged side view showing a portion of FIG. 1.

FIG. 3 is a schematic perspective view showing the mechanical filter according to an embodiment of this invention.

FIG. 4 is a side view showing an example of the electro-mechanical transducer according to the present invention.

FIG. 5 is a perspective view showing an example of the reinforced connection of lead wires to the transducer of FIG. 4.

FIG. 6 illustrates the manner in which the electro-mechanical transducers are coupled together by a coupler in accordance with the present invention.

In order to give a better understanding of this invention, description will first be made with reference to FIGS. 1 and 2 showing a conventional mechanical filter which comprises a mechanical resonance portion including a plurality of resonators 1 coupled together by a coupler 2, electro-mechanical transducers 3 and 3' attached to the opposit ends of the coupler 2 respectively, and lead wires 4 and 4' leading out of the transducers respectively. The electro-mechanical transducers 3 and 3' are constituted by Langevin transducers well known in the art, and in this instance, the coupling between the transducers and the mechanical resonance portion are made in the manner as shown in FIG. 2. For convenience, FIG. 2 shows only one electro-mechanical transducer 3, but the same thing also applies to the other transducer 3'. More specifically, a pair of metallic terminal portions 3b and 3c are secured to the opposit faces of the transducer element 3a of the transducer 3, and a coupling hole 3d formed in, for example, one of the metallic terminal portions, 3c, and one end of the coupler 2 are coupled together as by screwing, brazing, soldering, mating or the like. As the resonator 1, use is usually made of longitudinal (thickness) resonators, torsional resonators, bending resonators or the like, and the coupler 2 is usually constituted by a longitudinal resonator. Coupling between these resonators and the coupler is usually accomplished as by brazing or spot welding.

The mechanical filter constructed as described above has such merits as good efficiency and stability of the electro-mechanical transducer, low impedance and the ease with which lead wires may be led out from the metallic terminals, structural sturdiness, etc. However, the Langevin transducers used as the electro-mechanical transducers, as is apparent from what has been described above, are complicated in construction accordingly difficult to machine. Moreover, any of the above-mentioned methods of coupling the transducers to the mechanical resonance portion offers its peculiar problem, that is, the method using the screwing requires the step of tapping, the method using the brazing or soldering requires partial heating, or the method using the mating raises the need for dimensional precision of the hole 3d, and thus carrying out any of such methods is cumbersome in itself.

Description will now be made of an embodiment of this invention with reference to FIGS. 3 to 6.

Referring to FIG. 3 which is a schematic perspective view showing the mechanical filter embodying the present invention, this filter is similar to the filter of FIG. 1 in that it includes a plurality of resonators 11 coupled together by a coupler. Again in this case, the resonators 11 may be constituted by longitudinal (thickness) resonators, torsional resonators, bending resonators or the like, and the coupler 12 may be formed by a longitudinal resonance (fine wire) coupler. In this embodiment, it should first be noted that electro-mechanical transducers 14 and 14' connected to the opposite ends of the coupler 12 are designed to have a construction as shown in FIG. 4. For convenience, FIG. 4 shows only the transducer 14, but of course the other transducer 14' is of identical construction. As seen in FIG. 4, the electro-mechanical transducers 14 and 14' in the present invention may each be constituted as by longitudinal (thickness) resonator 14a formed of pillar-like piezoelectric ceramic, electrodes 14b and 14c are attached to the opposite end faces of the resonator 14a in the direction of resonance thereof, and a hole or recess 14d is formed in one end face of the resonator 14a (in the shown embodiment, that end face which has the electrode 14c attached thereto), the hole or recess 14d being located substantially on the axis of the resonator 14a and extending axially thereof. The hole or recess 14d may be of circular, polygonal or other suitable cross-sectional shape, and the internal wall thereof need not be covered with the aforementioned electrode. The depth of the hole 14d may preferably be chosen to about 1.5 to about 3 times the diameter of the hole. The coupling between the transducers and the coupling may be accomplished simply and reliably by inserting each end of the coupler 12 into such hole 14d and using a suitable electrically conductive adhesive 16, in the manner as shown in FIG. 6. It will be appreciated that the electro-mechanical transducer of the present invention thus formed is very much simplified as compared with the above-described Langevin transducer. Next, lead wires 15 and 15' covered with an insulating sheath such as polyurethane are respectively connected to the electrodes 14b and 14c on the opposite end faces of the ceramic resonator 14a of the transducer by soldering or other suitable means. Preferably, these lead wires 15 and 15' may be wound, for example, through one or two turns on the periphery of the ceramic resonator (in planes perpedicular to the direction of resonance), and then secured thereto by applying thereover an adhesive 17 having rubber-like elasticity, in the manner as shown in FIG. 5, thereby providing reinforcement for the lead wires 15 and 15'.

According to the present invention, as will be appreciated, the electro-mechanical transducers 14 and 14' are extremely simplified and therefore suited for mass production and lower in cost. Further, the use of an adhesive for coupling the coupler and the transducers permits the machining precision of the coupling holes or recesses formed in the ceramic resonators to be less strict than in the conventional coupling methods such as screwing, mating, etc., and this in turn means the ease of the hole machining which also leads to a benefit such as better machining efficiency or the like. Furthermore, by making the mechanical filter of the present invention usable as a mechanical filter of narrow band whose center frequency is in the neighborhood of 455 KHz, it is possible to employ piezoelectric ceramic resonators of longitudinal resonance, thus enabling the machining of the holes in the end face thereof. Also, the narrow band in the neighborhood of 455 KHz leads to an advantage that impedance can be brought into a practicable range, say, several kilo-ohms or less.

While the present invention has been shown and described with respect to a specific embodiment thereof, it should be understood that the present invention is not restricted to such an embodiment but includes all changes and modifications which will fall within the spirit and scope of this invention as defined in the appended claims.

What is claimed is:

1. A mechanical filter including resonators, a coupler for longitudinally coupling said resonators, electro-mechanical transducers coupled to the opposite ends of said coupler, and lead wires led out from said transducers, said electro-mechanical transducers each comprising a piezoelectric ceramic resonator adapted for longitudinal resonance and having electrodes attached to the opposite end faces thereof, one of the end faces of said piezoelectric ceramic resonator being formed with a coupling hole located substantially on the axis thereof and extending lengthwise of said ceramic resonator, an end of said coupler being inserted into said coupling hole with an electrically conductive adhesive to thereby couple said coupler and said ceramic resonators, said lead wires being connected to said electrodes and wound about said piezoelectric ceramic resonators through a predetermined number of turns, said turns of said lead wires being secured to said ceramic resonators by an adhesive having rubber-like elasticity.

* * * * *